(12) United States Patent
Tamura et al.

(10) Patent No.: US 9,143,127 B2
(45) Date of Patent: Sep. 22, 2015

(54) OPERATION SWITCH DEVICE (71) Applicant: Wacom Co., Ltd., Saitama (JP)

(72) Inventors: Hideo Tamura, Saitama (JP); Hiromichi Kanzaki, Saitama (JP)

(73) Assignee: Wacom Co., Ltd., Saitama (JP)

( * ) Notice: Subject to any disclaimer, the term of this patent is extended or adjusted under 35 U.S.C. 154(b) by 309 days.

(21) Appl. No.: 13/679,755

(22) Filed: Nov. 16, 2012

(65) Prior Publication Data
US 2013/0161179 A1    Jun. 27, 2013

(30) Foreign Application Priority Data

Dec. 27, 2011    (JP) ................. 2011-284714

(51) Int. Cl.
*H03K 17/975*    (2006.01)
*H03K 17/96*    (2006.01)
*G06F 3/044*    (2006.01)
*G06F 3/041*    (2006.01)

(52) U.S. Cl.
CPC .............. *H03K 17/962* (2013.01); *G06F 3/044* (2013.01); *G06F 3/0414* (2013.01)

(58) Field of Classification Search
CPC ..... G06F 3/044; G06F 3/0489; H03K 17/955; H03K 17/962
USPC .......................................... 200/600; 341/33
See application file for complete search history.

(56) References Cited

U.S. PATENT DOCUMENTS

| 7,642,673 | B2 * | 1/2010 | Baier ........................... 307/104 |
| 7,829,812 | B2 | 11/2010 | Tolbert et al. |
| 7,915,556 | B2 * | 3/2011 | Ou ................................ 200/600 |
| 8,124,903 | B2 * | 2/2012 | Tatehata et al. ............... 200/600 |
| 8,149,220 | B2 | 4/2012 | Fukushima et al. |
| 2009/0008234 | A1 | 1/2009 | Tolbert et al. |
| 2009/0160790 | A1 | 6/2009 | Fukushima et al. |
| 2012/0199459 | A1 * | 8/2012 | Reise ........................... 200/5 A |

FOREIGN PATENT DOCUMENTS

| JP | 2006253000 A | 9/2006 |
| JP | 2007173067 A | 7/2007 |
| JP | 2007335374 A | 12/2007 |
| JP | 2009003796 A | 1/2009 |
| JP | 2010532030 A | 9/2010 |

* cited by examiner

*Primary Examiner* — Felix O Figueroa
(74) *Attorney, Agent, or Firm* — Seed IP Law Group PLLC (57) ABSTRACT

An operation switch device includes a circuit board and a push switch disposed on the circuit board and including a movable part exposed to an outside for reacting to an external pressing operation. Also provided on the circuit board is a touch detecting electrode formed in proximity to the push switch. The operation switch device further includes an operation detecting circuit connected with the push switch and the touch detecting electrode, and an operation member disposed to oppose the circuit board with the push switch interposed between the operation member and the circuit board. The operation member is displaceable such that the pressing operation on the operation member causes depression of the movable part of the push switch. The operation detecting circuit detects a touch operation on the operation member using the touch detecting electrode, and detects the pressing operation on the operation member using the push switch.

12 Claims, 9 Drawing Sheets

OPERATION SWITCH DEVICE

CROSS-REFERENCE(S) TO RELATED APPLICATION(S)

The present application claims priority under 35 U.S.C. 119(a) of Japanese Application No. 2011-284714, filed Dec. 27, 2011, the entire content of which is incorporated herein by reference.

BACKGROUND

1. Technical Field

The present invention relates to an operation switch device capable of detecting both a touch operation and a pressing operation.

2. Description of the Related Art

Operation switch devices capable of sensing both touching and pressing of an operation switch by a finger or the like are disclosed, for example, in Patent Document 1 (Japanese Patent No. 4438648), Patent Document 2 (JP-T-2010-532030), Patent Document 3 (Japanese Patent No. 4629621), Patent Document 4 (Japanese Patent No. 4594229), and the like.

The operation switch devices described in these patent documents have a structure, in which a sensor section for sensing a touch operation is integrally formed with a switch section for sensing a pressing operation, as a whole.

The sensor section for sensing a touch operation in each of the operation switch devices in Patent Documents 1 to 4 is configured to detect the touch by a finger of a user as a change in capacitance. On the other hand, the switch section for sensing a pressing operation in Patent Documents 1 and 2 uses a dome-shaped electrode, which provides tactile feedback of the pressing operation to a user and which restores itself to its original switch state. The switch section for sensing a pressing operation in Patent Documents 3 and 4 uses an elastically deformable thin skirt-shaped member, which provides tactile feedback of the pressing operation to a user and which restores itself to its original switch state.

Figure 11:
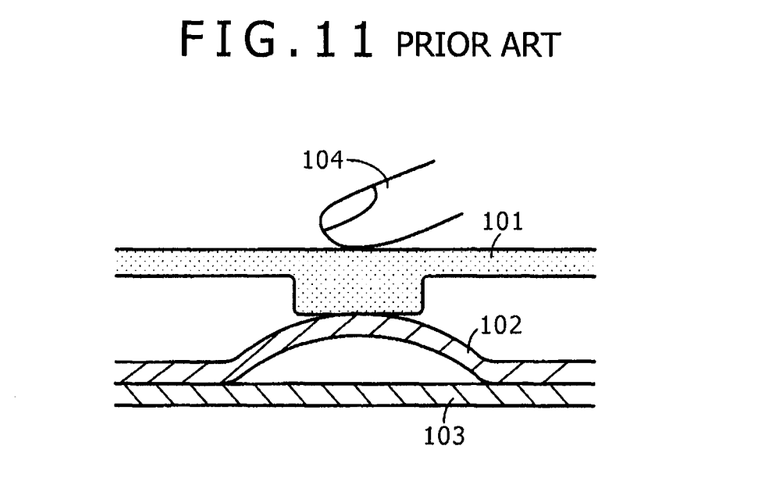
FIG. 11 is a diagram illustrating an example of an existing operation switch device.

FIG. 11 shows an exemplary construction of the operation switch device disclosed in Patent Document 2. The operation switch device includes a capacitive touch screen (capacitive touch sensing device) 101 formed by a flexible board having a conductive layer formed thereon, and a metallic switch dome 102 formed on a printed circuit board 103.

In the operation switch device of FIG. 11, when a user touches the touch screen 101 with a finger 104, the touch screen 101 senses the touch of the finger 104 with a capacitive touch detection system. When the switch dome 102 is depressed by the finger 104 of the user via the touch screen 101, the switch dome 102 provides an on-off signal corresponding to the depression.

Figure 12:
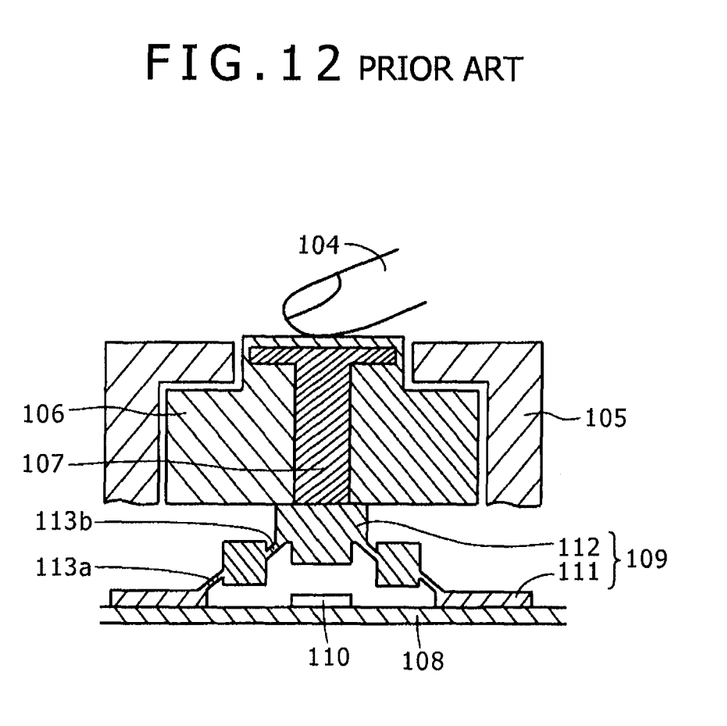
FIG. 12 is a diagram illustrating another example of an existing operation switch device.

FIG. 12 shows an exemplary construction of the operation switch device disclosed in Patent Document 3. The operation switch device includes an operation key 106 disposed so as to be movable in a vertical direction with respect to a device main body 105, a touch detecting electrode 107 embedded in the operation key 106, an electrode section 109 disposed on a printed circuit board 108, and a proximity sensor 110.

The electrode section 109 includes a fixed electrode 111 fixed to the printed circuit board 108 and a movable electrode 112. The movable electrode 112 is coupled to the fixed electrode 111 via electrode flexible sections 113a and 113b that form a thin skirt-shaped member, and is thus movable in the vertical direction. The touch detecting electrode 107 is electrically connected to the movable electrode 112.

The proximity sensor 110 is disposed on the printed circuit board 108. The movable electrode 112 is separated from the proximity sensor 110 by a predetermined distance when the operation key 106 is not depressed. When the operation key 106 is depressed, the movable electrode 112 approaches the proximity sensor 110 according to the depression based on bending displacement of the electrode flexible sections 113a and 113b that form the thin skirt-shaped member.

In the operation switch device of FIG. 12, a high-frequency signal is supplied to the touch detecting electrode 107, and the high-frequency signal is output as a touch detection signal. In the operation switch device, when a user touches the operation key 106 with a finger 104, a capacitance formed between the finger 104 and the touch detecting electrode 107 changes the level of the high-frequency signal supplied to the touch detecting electrode 107. The touch of the finger 104 on the operation key 106 is detected by detecting this level change.

When the movable electrode 112 approaches the proximity sensor 110 due to the depression of the operation key 106, a switch signal corresponding to the depressing operation is output from the proximity sensor 110.

BRIEF SUMMARY

As described above, the existing operation switch devices capable of detecting both a touch operation and a pressing operation have a structure in which a sensor section for sensing a touch operation is integrally formed with a switch section for sensing a pressing operation, as a whole. Integrally forming the two sections leads to the problem of having a complex overall structure. In addition, as described above, the switch section for sensing a pressing operation uses a dome-shaped electrode or a skirt-shaped member as a part forming the operation switch device, which leads to the problem of complicating the assembly process of the operation switch, which in turn increases manufacturing cost.

In addition, the integrated structure of the existing operation switch devices presents a maintenance problem in that when a movable part becomes defective due to wear and tear for example, it is not possible to repair only the defective part. Instead, the entire operation switch device needs to be replaced.

In view of the above, various aspects of the present invention provide an operation switch device capable of detecting both a touch operation and a pressing operation, which has a simple structure, which can be manufactured at low cost, which is highly reliable, and which is easy to maintain.

Unlike the existing operation switch devices having an entirely integrated structure for detecting both a touch operation and a pressing operation, an operation switch device according to an embodiment of the present invention includes a push switch as a complete (finished) part to obtain a signal corresponding to a pressing operation. The operation switch device then has a structure for detecting a touch operation, which functions in cooperation with the push switch disposed on a circuit board. These concept and configuration provide an operation switch device, which has a simple structure as an operation switch device, which can be manufactured at low cost, which is highly reliable, and which is easy to maintain.

Specifically, according to an embodiment of the present invention, an operation switch device is provided including: a circuit board and a push switch disposed on the circuit board to have a determined height above the circuit board. The push switch includes a movable part exposed to an outside for reacting to a pressing operation. Also formed on the circuit board is a touch detecting electrode in proximity to the push switch. The operation switch device further includes an operation detecting circuit connected with the push switch and the touch detecting electrode. The operation switch device still further includes an operation member disposed to oppose the circuit board with the push switch interposed between the operation member and the circuit board. The operation member is displaceable such that a pressing operation on the operation member causes depression of the movable part of the push switch. The operation detecting circuit detects a touch operation on the operation member using the touch detecting electrode formed in proximity to the push switch on the circuit board, and detects a pressing operation on the operation member using the push switch.

In the operation switch device having the above-described construction according to the present invention, the push switch which is a discrete electronic part is disposed on the circuit board. The touch detecting electrode is formed on the same printed circuit board in the periphery of the push switch.

The operation member is disposed so as to oppose the touch detecting electrode on the circuit board, with the push switch interposed between the operation member and the circuit board.

Thus, when the user touches the operation member with a finger, the operation detecting circuit based on the capacitive touch detection system detects the touch operation based on the output signal from the touch detecting electrode. Further, when the user presses the operation region, the push switch (located beneath the operation region) changes its switch state according to the pressing operation. The operation detecting circuit thus detects the pressing operation on the basis of the change in the switch state of the push switch.

The operation switch device according to the present invention has a simple constitution including the circuit board, on which the touch detecting electrode is formed and the push switch is attached, and the operation member disposed so as to oppose the circuit board. Therefore the operation switch device according to the present invention can be manufactured at low cost. In addition, the operation switch device according to the present invention is easy to maintain because it suffices to replace only the push switch when the push switch become faulty.

DETAILED DESCRIPTION

An electronic device including a plurality of operation switch devices according to an embodiment of the present invention will hereinafter be described with reference to the drawings. The electronic device to be described in the following is a tablet device, which allows writing of characters and drawing of pictures thereon with an electronic pen as a position indicator. The tablet device according to the present embodiment is configured such that operation switch devices according to the present embodiment are used to control auxiliary functions of the tablet device when a user draws characters or pictures with the electronic pen. The operation switch devices may also be used to control general operation of the tablet device.

Figure 1:
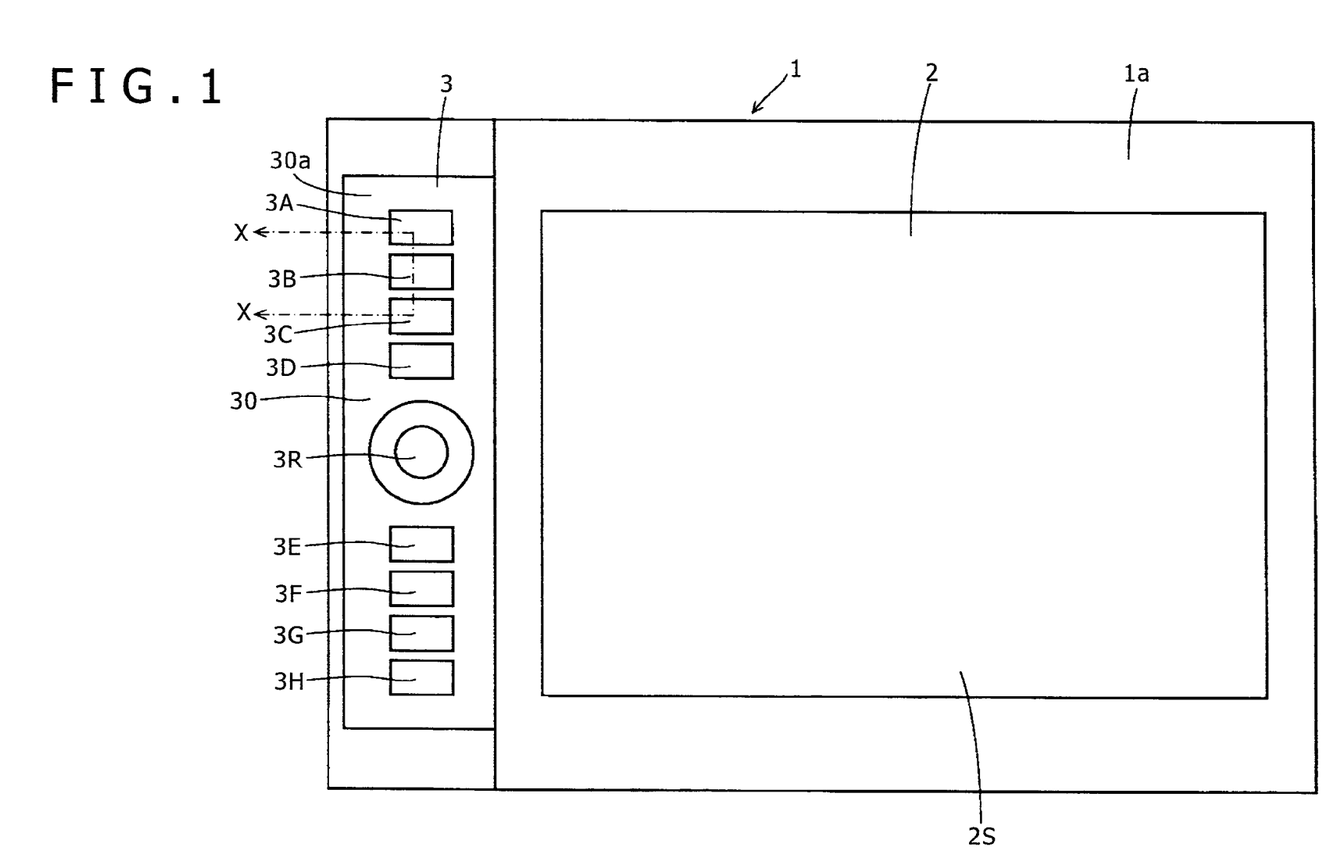
FIG. 1 is a diagram showing an external appearance of a tablet device as an example of an electronic device to which an embodiment of an operation switch device according to the present invention is applied.

FIG. 1 is a diagram showing an external appearance of the tablet device 1 as an example of the electronic device according to the present embodiment. The casing of the tablet device 1 as a whole has an external shape in the form of a thin plate, and includes an upper case 1a and a lower case (not shown). FIG. 1 is a diagram of the upper case 1a as viewed from above. An input region 2 for detecting an operational input by the electronic pen, for example, and an operation switch section 3 are formed on the surface of the upper case 1a. The operation switch section 3 includes the operation switch devices according to the embodiment of the present invention.

The tablet device 1 in the present example is connected to a personal computer (hereinafter referred to as a PC), which is not shown in the figure. The tablet device 1 is configured such that characters and pictures input in the input region 2 of the tablet device 1 with the electronic pen are displayed on the display screen of the PC. The input region 2 corresponds to a display screen region of the PC.

A sensor section 2S for detecting an input operation by the electronic pen is provided in a position corresponding to the input region 2 of the upper case 1a of the tablet device 1. In the present embodiment, the sensor section 2S has a sensor section configuration of an electromagnetic induction system. The sensor configuration of an electromagnetic induction system is described, for example, in Japanese Patent Laid-Open No. 2009-3796 and the like, and therefore detailed description thereof will be omitted. The sensor section 2S includes a sensor substrate (not shown), on which an X-axis direction loop coil group and a Y-axis direction loop coil group, for example, are formed. The sensor section 2S sends out an output signal corresponding to an (X, Y) coordinate position indicated by the electronic pen. The input region 2 is disposed such that a protective sheet covering the sensor substrate is exposed to the outside.

As shown in FIG. 1, the operation switch section 3 is disposed in a side portion of the upper case 1a of the tablet device 1 adjacent to the pen input region 2. The operation switch section 3 in the present example has nine operation regions 3A, 3B, 3C, 3D, 3E, 3F, 3G, 3H, and 3R formed therein. In the present example, the operation regions 3A to 3H each have a quadrilateral region shape, and the operation region 3R has a circular region shape.

In the present embodiment, as will be described later, when a user touches each of the operation regions 3A to 3H and 3R with a finger, the touch can be detected by a capacitive touch detection system. In addition, when the user presses each of the operation regions 3A to 3H and 3R with a finger, the operation region is bent toward the inside of the casing of the tablet device 1 so as to depress a push switch disposed within the casing of the tablet device 1, to thereby perform a switch operation.

The respective operations of depressing the operation regions 3A to 3H and 3R are assigned different functions of the table device 1 such as displaying a set menu, selecting various modes, returning to the previous screen, enlarging, reducing, moving, rotating, and scrolling characters or pictures on the display screen, and the like. The user can perform input operation on the input region 2 with one hand holding the electronic pen, while operating on the operation regions 3A to 3H and 3R with the other hand.

The operation switch section 3 includes an operation board section 30, which is a part separate from the upper case 1a, and an operation switch circuit board disposed under the operation board section 30 and within the casing of the tablet device 1 (the operation switch circuit board will hereinafter be abbreviated to a circuit board). The operation regions 3A to 3H and 3R are disposed in the operation board section 30. The operation board section 30 constitutes an operation member of the operation switch devices.

Figure 2A:
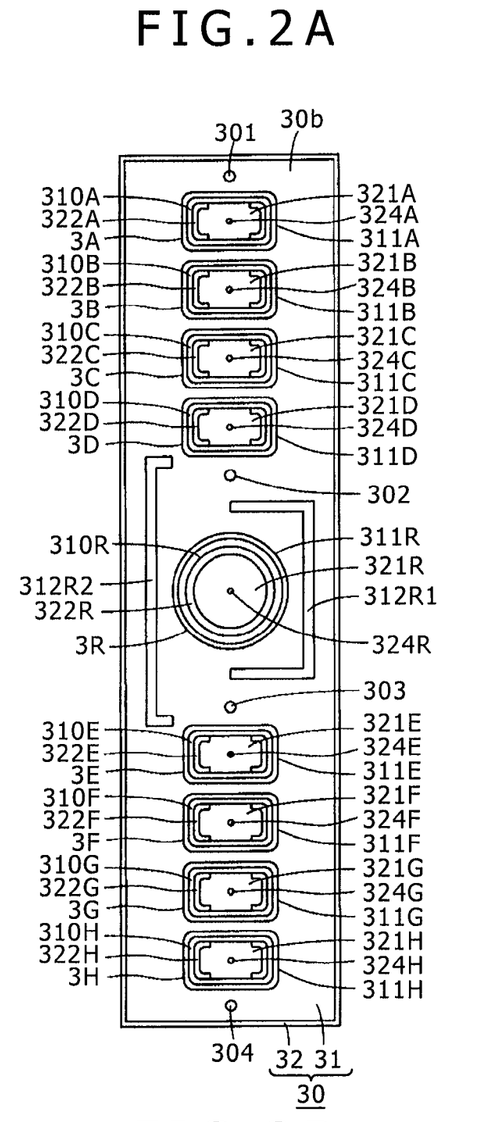
FIGS. 2A, 2B, 2C, and 2D are diagrams illustrating a sample configuration of the embodiment of the operation switch device according to the present invention.
Figure 2B:
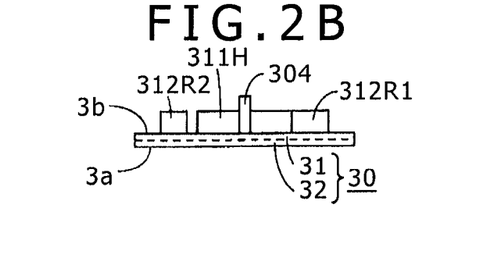
Figure 2C:
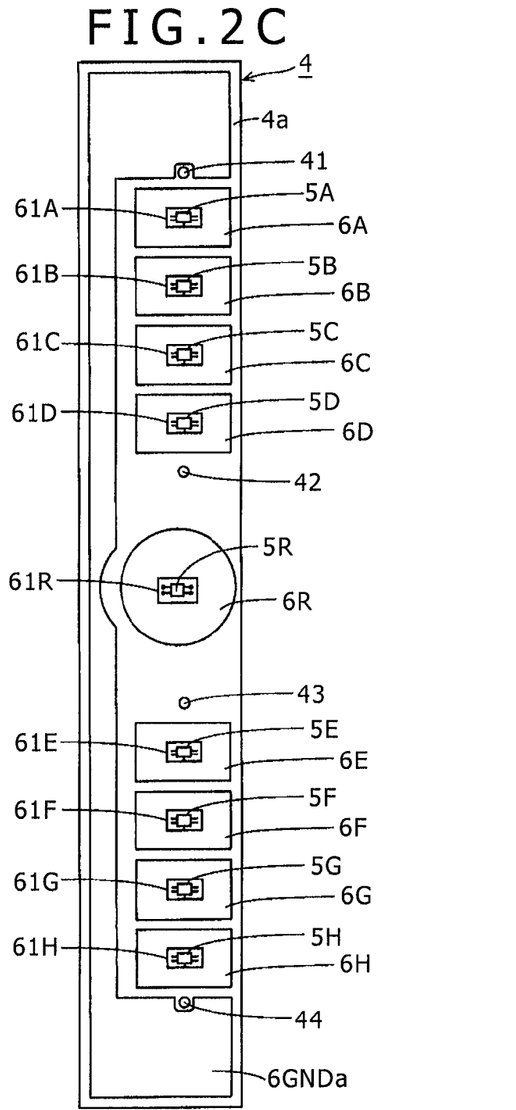
Figure 2D:
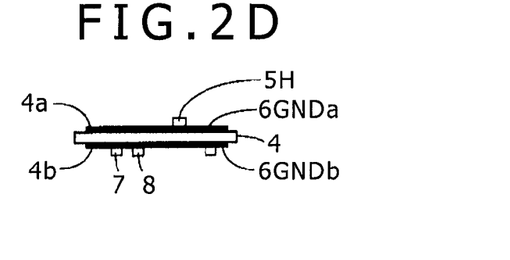

FIG. 2A is a diagram of the operation board section 30 as viewed from the side of a back surface 30b (inside of the casing) opposed to a front surface 30a exposed to the outside. FIG. 2B is a diagram of the operation board section 30 as viewed in a direction orthogonal to a direction of thickness of the operation board section 30 and from the side of a short side of the operation board section 30. FIG. 2C is a diagram showing the side of a surface 4a of the circuit board 4 disposed within the casing, the surface 4a facing the back surface 30b of the operation board section 30 as shown in FIG. 2A. FIG. 2D is a diagram of the circuit board 4 as viewed in a direction orthogonal to a direction of thickness of the circuit board 4 and from the side of a short side of the circuit board 4.

Touch detecting electrodes 6A, 6B, 6C, 6D, 6E, 6F, 6G, 6H, and 6R forming a sensor section of the capacitive touch detection system are formed as a conductor pattern by printing in the surface 4a of the circuit board 4 so as to correspond to and face the respective operation regions 3A to 3H and 3R of the operation board section 30. In the present example, the touch detecting electrodes 6A, 6B, 6C, 6D, 6E, 6F, 6G, and 6H have a rectangular shape corresponding to the rectangular operation regions 3A, 3B, 3C, 3D, 3E, 3F, 3G, and 3H of the operation board section 30. In the present embodiment, the outside dimensions of the touch detecting electrodes 6A, 6B, 6C, 6D, 6E, 6F, 6G, and 6H are slightly larger than those of the operation regions 3A, 3B, 3C, 3D, 3E, 3F, 3G, and 3H. In addition, the conductor patterns of the touch detecting electrodes 6A, 6B, 6C, 6D, 6E, 6F, 6G, and 6H have a shape symmetric with respect to central points of push switches 5A to 5H.

The touch detecting electrode 6R is formed in a region between the touch detecting electrode 6D and the touch detecting electrode 6E on the circuit board 4. The touch detecting electrode 6R has a circular shape corresponding to the circular operation region 3R, and is slightly larger than the operation region 3R.

The touch detecting electrodes 6A to 6H and 6R are formed as conductor patterns separated from each other on the circuit board 4 so as to be electrically disconnected from each other. Each of the touch detecting electrodes 6A to 6H and 6R is connected to a touch detecting circuit (IC (Integrated Circuit)) 7 of the capacitive touch detection system to be described later (see FIGS. 2D and 5) via a through hole not shown in the figures and via a conductor pattern formed on the back surface 4b of the circuit board 4.

In addition, regions 61A, 61B, 61C, 61D, 61E, 61F, 61G, 61H, and 61R, in which no conductor pattern is formed, are formed at substantially the central positions of the touch detecting electrodes 6A to 6H and 6R on the circuit board 4. The regions 61A to 61H and 61R in which no conductor pattern is formed on the surface 4a of the circuit board 4 have larger dimensions than the outside dimensions of the push switches 5A to 5H and 5R. The push switches 5A to 5H and 5R are arranged in the regions 61A to 61H and 61R. That is, the touch detecting electrodes 6A to 6H and 6R are respectively arranged in proximity to the positions where the push switches 5A to 5H and 5R are arranged on the surface 4a of the circuit board 4.

In this case, the switch terminals of the push switches 5A to 5H and 5R are electrically connected by soldering to wiring (not shown) disposed on the circuit board 4 within the regions 61A to 61H and 61R. A switch state detecting circuit (IC) 8 (see FIGS. 2D and 5) for detecting the respective on-off states of the push switches 5A to 5H and 5R is provided on the back surface 4b of the circuit board 4. Each of the push switches 5A to 5H and 5R is connected to the switch state detecting circuit 8 via the above wiring.

In the present example, a switch (push switch) of a product number EVPAA102K manufactured by Panasonic Electronic Device Co., Ltd., for example, is used as the electronic parts (finished parts) of the push switches 5A to 5H and 5R. This push switch has outside dimensions of length×width×height as 3.5 mm×2.9 mm×1.7 mm, and thus has a small size.

As described above, the touch detecting electrodes 6A to 6H and 6R are formed on the peripheries of the positions of the push switches 5A to 5H and 5R on the surface 4a of the circuit board 4. In this case, the positions of the push switches 5A to 5H and 5R correspond to the central portions of the touch detecting electrodes 6A to 6H and 6R. The touch detecting electrodes 6A to 6H and 6R thus have a shape axisymmetric with respect to a straight line passing through the centers of the push switches 5A to 5H and 5R as an axis of symmetry.

A grounding electrode 6GNDa made of a conductor pattern is formed on the surface 4a of the circuit board 4 so as to surround the touch detecting electrodes 6A to 6H and 6R. Therefore touch detection at the touch detecting electrodes 6A to 6H and 6R can be performed more stably.

In the present example, a grounding electrode 6GNDb made of a conductor pattern (see FIG. 2D) is formed over substantially the whole of the back surface 4b of the circuit board 4. Thus, the touch detecting electrodes 6A to 6H and 6R in the present embodiment do not detect the touch by a finger on the back surface 4b of the circuit board 4.

As shown in FIGS. 2A and 2B, the operation board section 30 includes a plate-shaped member 31 formed by a resin, for example, and a protective sheet member 32 covering the front surface of the plate-shaped member 31 on the side of the front surface 30a of the operation board section 30 and covering the side surface(s) of the plate-shaped member 31. The protective sheet member 32 in the present example is formed by a sheet member made of a dielectric rubber, for example, which is a dielectric elastic material having a higher dielectric constant than both air and the plate-shaped member 31. The protective sheet member 32 is bonded to the plate-shaped member 31 by an adhesive material. The detection sensitivity of touch detection is improved by providing a dielectric or a dielectric elastic body to the operation board section 30.

Through holes 310A, 310B, 310C, 310D, 310E, 310F, 310G, 310H, and 310R having a size corresponding to the operation regions 3A, 3B, 3C, 3D, 3E, 3F, 3G, 3H, and 3R are formed in the plate-shaped member 31. The operation board section 30 is formed with the protective sheet member 32 bonded to the plate-shaped member 31 so as to cover the entire surface of the plate-shaped member 31 including the portions corresponding to the through holes 310A to 310H and 310R.

Thus, in the operation board section 30, only the protective sheet member 32 is present in the regions, in which the through holes 310A to 310H and 310R are formed in the plate-shaped member 31, i.e., the operation regions. Therefore, when the user presses the operation regions 3A to 3H and 3R with a finger from the side of the front surface 30a of the operation board section 30, the protective sheet member 32 is displaced so as to be bent toward the inside of the casing of the tablet device 1 via the through holes 310A to 310H and 310R of the plate-shaped member 31.

In this case, as will be described later, when the operation board section 30 is aligned and coupled with the circuit board 4, the push switches 5A to 5H and 5R are respectively arranged in substantially the central portions of the through holes 310A to 310H and 310R of the plate-shaped member 31, that is, the central portions of the operation regions 3A to 3H and 3R.

Figure 3:
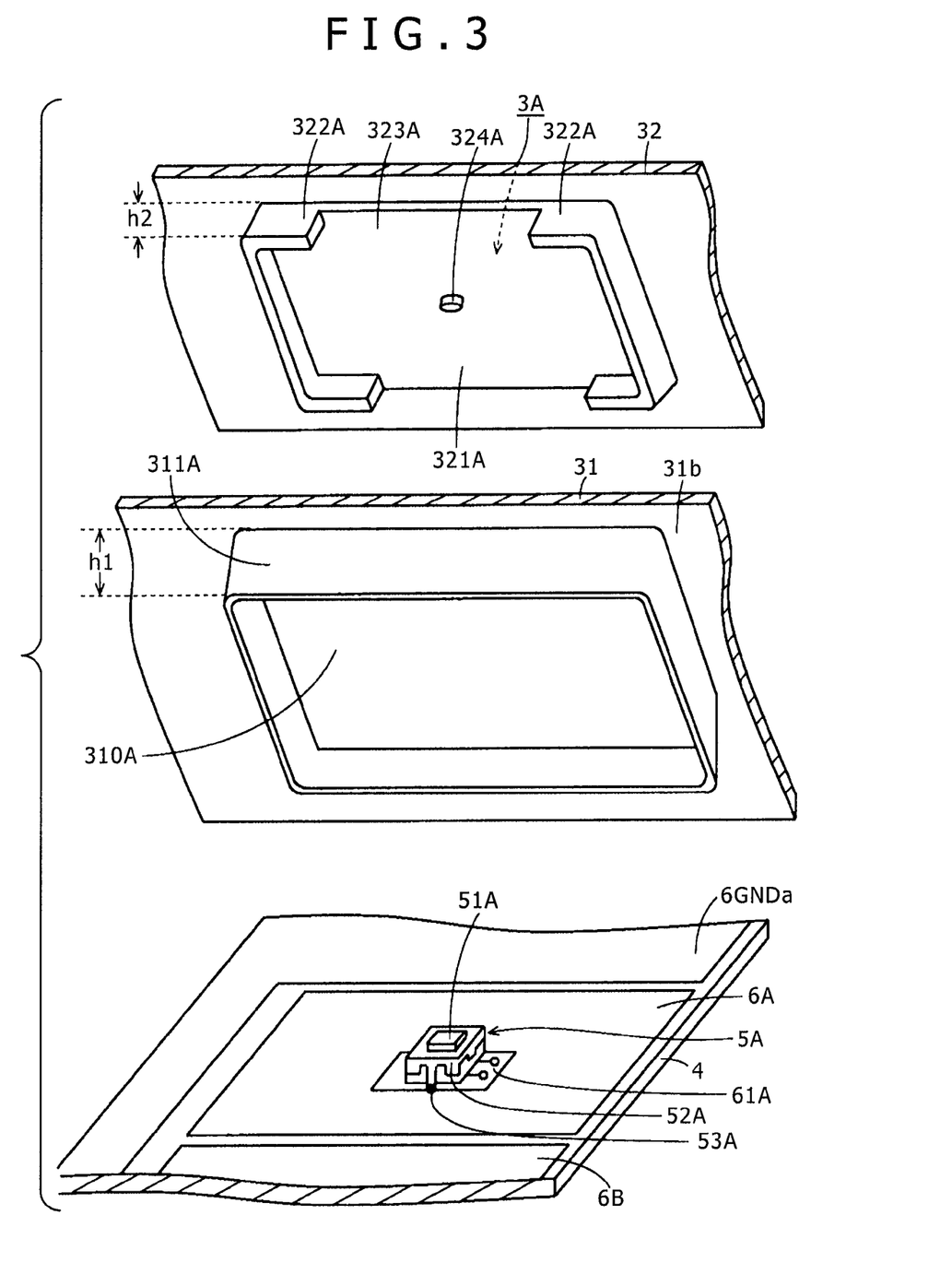
FIG. 3 is an exploded perspective view of a sample construction of principal parts of the embodiment of the operation switch device according to the present invention.

FIG. 3 is an exploded perspective view of the operation switch section 3 in more detail. FIG. 3 shows portions of the protective sheet member 32 and the plate-shaped member 31 for one operation region 3A of the operation board section 30, and the corresponding push switch 5A and touch detecting electrode 6A provided on the circuit board 4. The other operation regions 3B, 3C, 3D, 3E, 3F, 3G, and 3H in the rectangular shape are formed in the same manner as the operation region 3A in FIG. 3. In addition, the operation region 3R is also formed in a manner similar to the operation region 3A in FIG. 3 except that the operation region 3R has a circular shape.

As shown in FIG. 3, the plate-shaped member 31 is provided with the through hole 310A, and an annular rib 311A of a predetermined height h1 is formed to extend from the periphery of the through hole 310A on the back surface side of the plate-shaped member 31. The height h1 of the annular rib 311A is larger than the height of the push switch 5A above the circuit board 4, such that the push switch 5A can be depressed when the user depresses the operation region 3A.

The annular rib 311A has a role of separating the operation region 3A from the operation region 3B disposed adjacent to the operation region 3A, as well as a role of a spacer for separating the circuit board 4 and the operation board section 30 from each other by the height h1. In this case, the annular rib 311A is formed on the side of the back surface 31b of the plate-shaped member 31 such that a region enclosed by the annular rib 311A is included in a region in which the corresponding touch detecting electrode 6A is formed.

On the other hand, on the surface of the protective sheet member 32 facing the circuit board 4 through the through hole 310A of the plate-shaped member 31, a dielectric member 321A having an area slightly smaller than that of the through hole 310A is formed in correspondence to the operation region 3A. The dielectric member 321A may be formed separately from the protective sheet member 32 and then bonded to the protective sheet member 32. However, in the present example, the dielectric member 321A is formed integrally with the protective sheet member 32 made of a dielectric rubber as a dielectric elastic member. A silicon conductive rubber or a pressure conductive rubber (PCR: Pressure sensitive Conductive Rubber), for example, which has a higher dielectric constant than air, may be used as the dielectric elastic member of the dielectric member 321A. The dielectric member 321A need not be an elastic member.

The material thickness of the peripheral portion of the dielectric member 321A is set larger than that of the central portion of the dielectric member 321A in correspondence with the height of the push switch 5A disposed on the circuit board 4. In other words, the dielectric member 321A has a projecting part (e.g., 322A) as a region having a material thickness set larger than the material thickness of a region facing the movable part of the push switch 5A having a predetermined height above the circuit board 4. The dielectric member 321A has a shape such that a distance (gap) between the projecting part (322A) having a larger material thickness and the touch detecting electrode 6A is smaller than the height of the push switch 5A disposed on the circuit board 4.

With the dielectric member 321A having such a shape, the distance between the projecting part (322A) provided to the dielectric member 321A and the touch detecting electrode 6A is smaller than the height of the push switch 5A above the circuit board 4. Therefore, the thickness of an air space between the touch detecting electrode 6A around (on the periphery of) the push switch 5A and the projecting part (322A) provided to the dielectric member 321A is reduced. As a consequence, due to the projecting part 322A, the dielectric constant in the operation region 3A becomes higher than the dielectric constant of an area other than the operation regions (3A-3R) of the operation board section 30. This makes it possible to increase a capacitance between the touch detecting electrode 6A and a finger of the user touching the operation region 3A, to thereby improve detection sensitivity for a touch operation.

In the present embodiment, in order to further improve the touch detection sensitivity, a rib 322A formed along the outline shape of the operation region 3A, for example, is disposed as a projecting part having a predetermined shape on the dielectric member 321A. The height h2 of the rib 322A is smaller than the height h1 of the annular rib 311A formed on the side of the back surface 31b of the plate-shaped member 31, such that h1>h2.

If the operation region 3A does not have an adjacent operation region 3B, the rib 322A formed on the dielectric member 321A may be formed as an annular rib having the height h2. In the present embodiment, however, the operation region 3B is present adjacent to the operation region 3A. Thus, if the rib 322A has an annular rib shape, a finger touching the operation region 3A may be detected not only by the touch detecting electrode 6A but also by the touch detecting electrode 6B that faces the adjacent operation region 3B.

Thus, in the present embodiment, the rib 322A formed on the dielectric member 321A has a cutaway part 323A formed by partially cutting away a rib part of a long side part of the annular rib adjacent to the other operation region. In the present example, as shown in FIG. 3, the rib 322A is formed only on a pair of sides (a pair of short sides) of the rectangular-shaped dielectric member 321A, which are opposed to each other in a direction that intersects with a direction in which the operation regions 3A to 3H and 3R are arranged.

That is, the distance between the dielectric member 321A and the touch detecting electrode 6A is made shorter (along the rib 322A) in the direction in which the operation regions 3A to 3H and 3R are arranged, while the distance between the dielectric member 321A and the touch detecting electrode 6A is made larger (along the cutaway part 323A) in the direction that intersects with the direction in which the operation regions 3A to 3H and 3R are arranged. Thus, the touch detection sensitivity is improved due to the rib 322A, while capacitance interference between the operation region 3A and the other operation region disposed adjacent to the operation region 3A is suppressed due to the cutaway part 323A. For this purpose, as an example, the dielectric member 321A having the rib 322A and the cutaway part 323A may be used.

In order to avoid erroneous detection of a finger by the adjacent touch detecting electrode, it may be preferable to form a cutaway in the long side of the annular rib 311A formed on the back surface 31b of the plate-shaped member 31 also. In this case, the long side of the annular rib 311A, in which the cutaway is formed, is adjacent to the other operation region, as in the case of the rib 322A.

The height of the cutaway part 323A is zero in the example of FIG. 3, but may be a predetermined height smaller than h2.

As shown in FIG. 3, the push switch 5A has a movable part 51A, which is exposed to the outside and which reacts to a pressing operation applied thereon. The push switch 5A changes its switch state when the movable part 51A reacts to the pressing operation. The push switch 5A is soldered and attached in the region 61A, which is in the central portion of the rectangular touch detecting electrode 6A formed on the surface 4a of the circuit board 4, as described above. The push switch 5A is attached so attached that the movable part 51A of the push switch 5A is exposed to the outside and is opposed to the operation region 3A.

The push switch 5A in the present embodiment has a metallic frame 52A and a grounding terminal 53A for grounding the metallic frame 52A in an outermost peripheral part of the push switch 5A. In the present embodiment, the grounding terminal 53A of the push switch 5A is electrically connected via soldering to the touch detecting electrode 6A, rather than to a grounding conductor, so that the metallic frame 52A of the push switch 5A forms part of the touch detecting electrode 6A. The metallic frame 52A of the push switch 5A therefore functions as a part of the touch detecting electrode 6A.

A projection part 324A for surely pressing the movable part 51A of the push switch 5A is formed on the center of the dielectric member 321A formed in the protective sheet member 32. Thus, when the metallic frame 52A of the push switch 5A is made to function as a part of the touch detecting electrode 6A, capacitive coupling is formed between the projection part 324A and the metallic frame 52A.

The construction of the operation region 3A has been described with reference to FIG. 3. As described above, however, each of the other operation regions 3B to 3H and 3R is formed in a similar manner, as shown in FIG. 2A. In FIG. 2A, parts of the operation regions 3B to 3H and 3R corresponding to the respective parts of the operation region 3A shown in FIG. 3 are identified by adding suffixes B to H and R to the same reference numerals.

Because there is a wide region between the operation region 3D and the operation region 3E, ribs 312R1 and 312R2 having the same height h1 as an annular rib 311R of the operation region 3R may be formed separately from the annular rib 311R, as shown in FIGS. 2A and 2B.

In the present embodiment, the operation switch section 3 is formed with the operation board section 30 superposed on the circuit board 4. In this case, in order for the respective central positions of the operation regions 3A to 3H and 3R of the operation board section 30 to be positioned in correspondence to the respective central positions of the touch detecting electrodes 6A to 6H and 6R on the circuit board 4, in the present example, through holes 41, 42, 43, and 44 for positioning are formed in the circuit board 4, and rod-shaped projection parts 301, 302, 303, and 304 to be inserted into the through holes 41, 42, 43, and 44 are formed on the operation board section 30.

The side of the back surface 30b of the operation board section 30 is opposed to the side of the surface 4a of the circuit board 4, and the rod-shaped projection parts 301, 302, 303, and 304 are inserted into the respective through holes 41, 42, 43, and 44 in the circuit board 4, whereby the operation board section 30 and the circuit board 4 are coupled with each other. In this coupled state, the projection parts 324A to 324H and 324R of the dielectric members 321A to 321H and 321R of the operation regions 3A to 3H and 3R are opposed to the movable parts 51A to 51H and 51R of the push switches 5A to 5H and 5R. When the operation regions 3A to 3H and 3R are not depressed, the projection parts 324A to 324H and 324R may abut against the movable parts 51A to 51H and 51R of the push switches 5A to 5H and 5R or may be separated from the movable parts 51A to 51H and 51R of the push switches 5A to 5H and 5R.

In addition, in this coupled state, the annular ribs 311A to 311H and 311R and the ribs 312R1 and 312R2 formed on the back surface 31b of the plate-shaped member 31 of the operation board section 30 serve as spacers for separating the operation board section 30 and the circuit board 4 from each other.

Figure 4A:
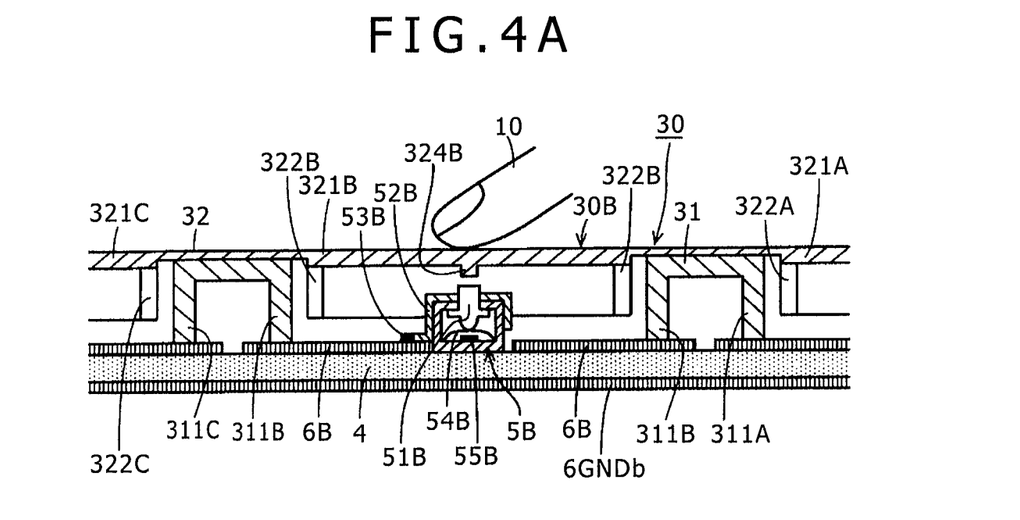
FIGS. 4A and 4B are sectional views of a sample construction of principal parts of the embodiment of the operation switch device according to the present invention.
Figure 4B:
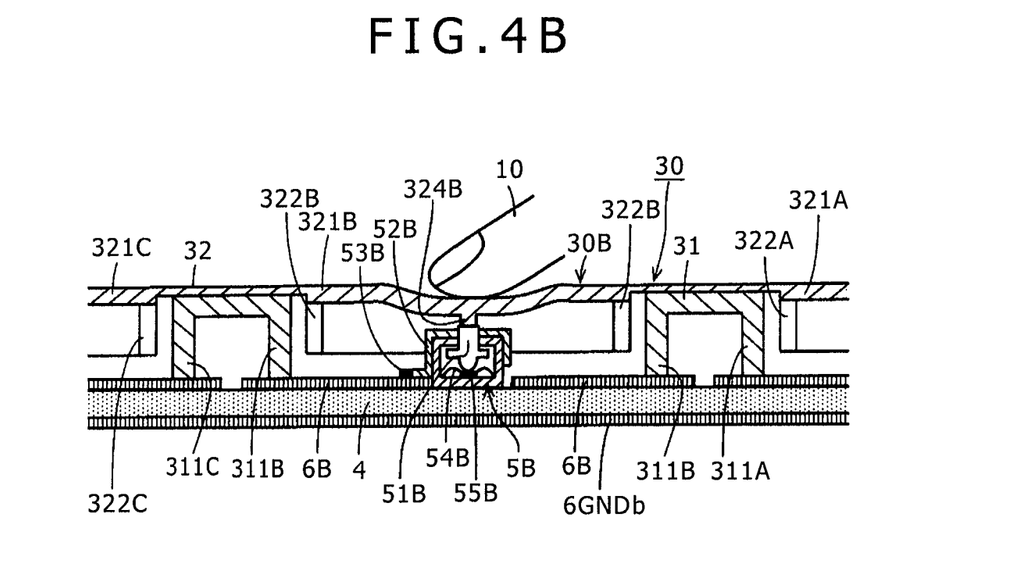

FIGS. 4A and 4B are sectional views of the operation board section 30 coupled with the circuit board 4, which is cut along a line X-X of FIG. 1 to show a portion around the operation region 3B. FIG. 4A shows a state in which a finger 10 of the user is touching the surface of the protective sheet member 32 in the operation region 3B. FIG. 4B shows a state in which the user's finger 10 is pressing the protective sheet member 32 in the operation region 3B to depress the push switch 5B.

As shown in FIG. 4A, in the state in which the finger 10 of the user is touching the surface of the protective sheet member 32 in the operation region 3B, the movable part 51B of the push switch 5B is not depressed. At this time, however, the touch detecting circuit 7 (shown in FIG. 5) connected with the touch detecting electrode 6B detects that the finger 10 has touched the operation region 3B. In FIG. 4A, because the metallic frame 52B of the push switch 5B is connected to the touch detecting electrode 6B via the grounding terminal 53B, the metallic frame 52B also functions as a part of the electrode for detecting the touch of the finger 10. Thus, when the operation region 3B is touched by the finger 10, the touch can be detected with high sensitivity.

As shown in FIG. 4B, when the user's finger 10 presses the operation region 3B, the protective sheet member 32 and the dielectric member 321B formed of a dielectric rubber as a dielectric elastic material are bent as shown in the figure, to thereby depress the movable part 51B of the push switch 5B. Then, within the push switch 5B, as schematically illustrated in FIG. 4B, the movable part 51B downwardly deforms the dome-shaped electrode 54B forming the switch to connect the dome-shaped electrode 54B to another electrode 55B of the switch. When the finger 10's pressing force is then removed, the dome-shaped electrode 54B of the switch is returned to its original shape, to be thereby disconnected from the other electrode 55B.

As described above, in the present embodiment, when the operation region 3B is touched by the finger 10, the touch is detected by the touch detecting electrode 6B. Further, when the operation region 3B is pressed by the finger 10, the switch state of the push switch 5B is changed, and thus the pressing operation is detected. The touch operation and the pressing operation by the finger 10 can be detected in the same manner in the other operation regions 3A, 3C to 3H, and 3R.

Figure 5:
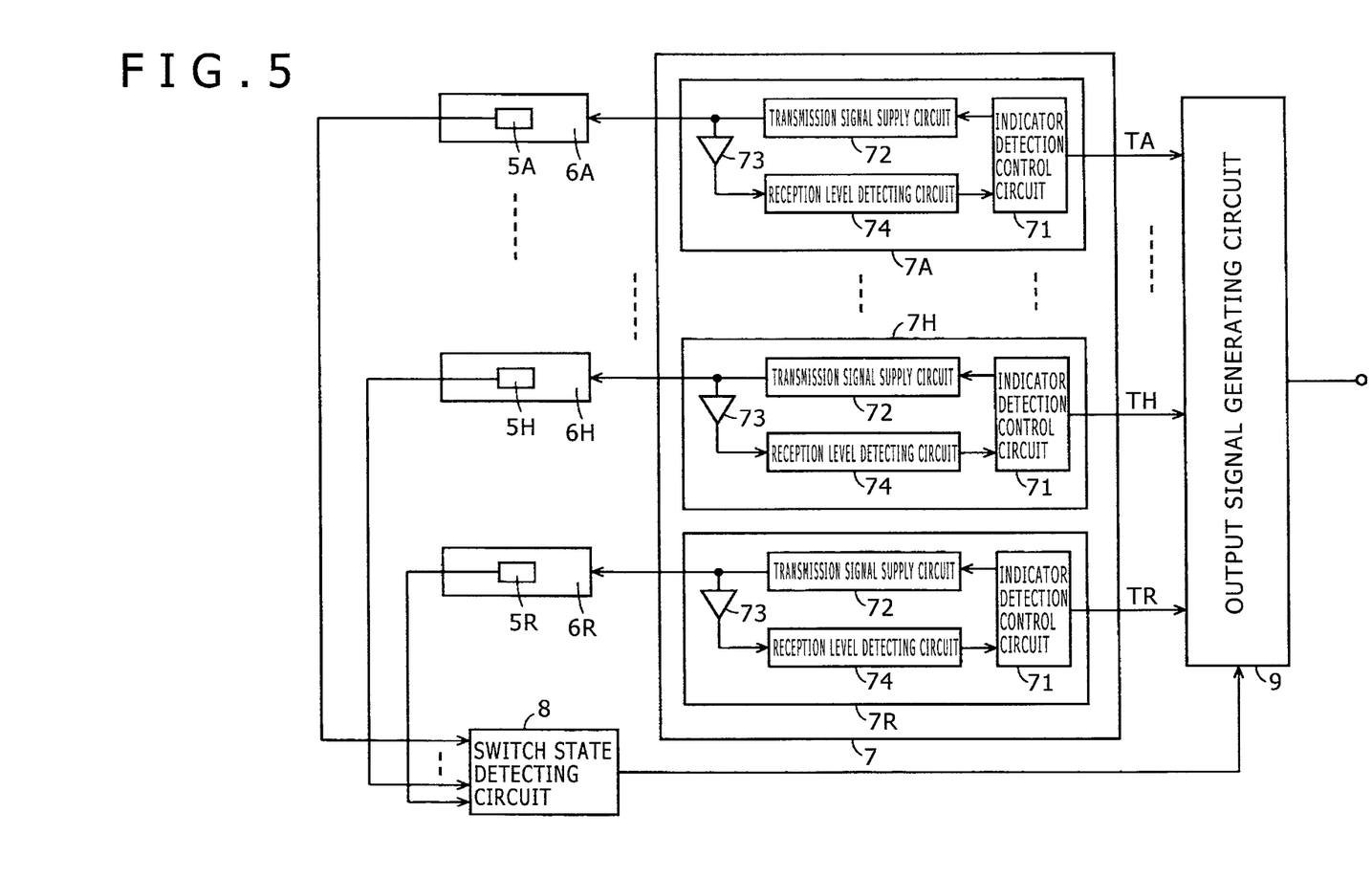
FIG. 5 is a block diagram of a sample configuration of a circuit section of the embodiment of the operation switch device according to the present invention.

FIG. 5 shows an example of a circuit configuration including the touch detecting circuit 7 and the switch state detecting circuit 8 for the operation switch section 3 of the tablet device 1 according to the present embodiment.

The touch detecting circuit 7 includes sensor circuit sections 7A to 7H and 7R for detecting the touch by a finger on the operation regions 3A to 3H and 3R corresponding to the respective touch detecting electrodes 6A to 6H and 6R by the capacitive touch detection system. The sensor circuit sections 7A to 7H and 7R have the same configuration. Each of the sensor circuit sections includes an indicator detection control circuit 71, a transmission signal supply circuit 72, a receiving amplifier 73, and a reception level detecting circuit 74.

In each of the sensor circuit sections 7A to 7H and 7R, the transmission signal supply circuit 72 outputs a transmission signal formed by an alternating-current signal of a predetermined frequency, for example, according to a control instruction from the indicator detection control circuit 71. The transmission signal is supplied to each of the touch detecting electrodes 6A to 6H and 6R. The transmission signal is also input to the reception level detecting circuit 74 via the receiving amplifier 73.

In relation to each of the operation regions 3A to 3H and 3R, when the operation regions 3A to 3H and 3R are not touched by a finger of the user, the signal input to the reception level detecting circuit 74 is a signal at a predetermined level En corresponding to the signal level of the transmission signal. The reception level detecting circuit 74 detects the predetermined level En, and outputs the predetermined level En to the indicator detection control circuit 71.

On the other hand, in relation to each of the operation regions 3A to 3H and 3R, when the operation regions 3A to 3H and 3R are touched by a finger of the user, a portion of the transmission signal supplied to the touch detecting electrodes 6A to 6H and 6R flows to a ground (earth) via the human body due to a capacitance formed by the finger and the touch detecting electrode (6A to 6H or 6R) touched by the finger. Thus, when the finger touches the touch electrode, a (negative) signal component that results from the touch appears via the receiving amplifier 73 and the level of the signal input to the reception level detecting circuit 74 changes to a level Es that is lower than En when no finger touches the touch electrode. Therefore, the reception level detecting circuit 74 detects the change in the signal level to the lower level Es, and outputs the change to the lower level Es to the indicator detection control circuit 71.

The indicator detection control circuit 71 compares a predetermined threshold level Eth (En>Eth>Es) with the level output from the reception level detecting circuit 74. When the level output from the reception level detecting circuit 74 is lower than the threshold level Eth, the indicator detection control circuit 71 detects that the operation region (3A to 3H or 3R) is touched by a finger of the user. The indicator detection control circuit 71 otherwise detects that the operation region is not touched by a finger. The indicator detection control circuit 71 outputs the detection output.

Then, each of the sensor circuit sections 7A to 7H and 7R outputs the detection output of the indicator detection control circuit 71 as touch detection output TA to TH and TR of each of the operation regions 3A to 3H and 3R to an output signal generating circuit 9.

When the transmission signals from the transmission signal supply circuits 72 in the sensor circuit sections 7A to 7H and 7R are the same signals, the transmission signals are supplied on a time-division basis so that the output timings of the transmission signals from the transmission signal supply circuits 72 in the sensor circuit sections 7A to 7H and 7R do not coincide with each other. Alternatively, the transmission signals from the transmission signal supply circuits 72 in the sensor circuit sections 7A to 7H and 7R can be supplied simultaneously by using signals of different frequencies or signals of different codes as the transmission signals from the transmission signal supply circuits 72 in the sensor circuit sections 7A to 7H and 7R.

In addition, respective switch output signals of the push switches 5A to 5H and 5R disposed on the circuit board 4 are supplied to the switch state detecting circuit 8. When one of the push switches 5A to 5H and 5R is depressed and the switch state of the push switch is thereby changed, the switch state detecting circuit 8 supplies information that identifies the depressed push switch to the output signal generating circuit 9. Also when a plurality of push switches of the push switches 5A to 5H and 5R are depressed simultaneously, the switch state detecting circuit 8 can detect the depressed push switches.

The output signal generating circuit 9 outputs information indicating the operation region touched by the finger among the operation regions 3A to 3H and 3R and the information indicating the depressed push switch. The output information of the output signal generating circuit 9 is supplied to, for example, the PC to which the tablet device 1 is connected.

Then, the PC can perform processing control such as generating a display, which corresponds to the function assigned to the operation region touched by the finger, on the screen and treating the depression of a push switch caused by a pressing operation on the same operation region as an operation to confirm the assigned function (i.e. operation to initiate the assigned function).

Effects of Embodiment

As described above, the operation switch section 3 according to the present embodiment makes it possible to realize an operation switch device, which can detect both a touch operation and a pressing operation with a simple configuration including the operation member formed by the operation board section 30 and the circuit board 4, on which the push switches 5A to 5H and 5R formed of existing electronic parts are arranged.

Push switches commercially available in the market as existing electronic parts, rather than push switches that are integrally constructed with other component parts to form operation switch devices, can be used as the push switches 5A to 5H and 5R. Thus, even when the push switches 5A to 5H and 5R become faulty due to wear and tear, it suffices to replace only the push switches, so that maintenance becomes easy.

The above-described embodiment has another effect in that the operation board section 30 that forms the operation member can be constructed by simply bonding the protective sheet member 32 formed of a dielectric elastic body, such as a dielectric rubber, to the plate-shaped member 31 made of a resin.

In the above-described embodiment, the operation regions have the through holes 310A to 310H and 310R in the plate-shaped member 31, and the protective sheet member 32 is opposed to the touch detecting electrodes 6A to 6H and 6R through the through holes 310A to 310H and 310R. Therefore, in the through hole parts 6A to 6H and 6R, the dielectric members 321A to 321H and 321R for improving the touch detection sensitivity of the sensors of the capacitive touch detection system can be disposed between the touch detecting electrodes 6A to 6H and 6R and the protective sheet member 32 forming an operation surface.

In the above-described embodiment, the ribs 322A to 322H and 322R are provided on the dielectric members 321A to 321H and 321R to project toward the side of the touch detecting electrodes 6A to 6H and 6R while avoiding the push switches 5A to 5H and 5R. Therefore the touch detection sensitivity of the sensors of the capacitive touch detection system can be further improved.

Further, the ribs 322A to 322H and 322R formed on the dielectric members 321A to 321H and 321R are arranged in a direction that intersects with the direction in which the plurality of operation regions 3A to 3H and 3R are arranged, while cut away structures are arranged in the direction in which the operation regions 3A to 3H and 3R are arranged. It is thus possible to suppress capacitance interference between adjacent operation regions, to thereby prevent erroneous detection of the touch by a finger.

In addition, as described above, while the dielectric members 321A to 321H and 321R can be formed by members separate from the protective sheet member 32, the dielectric members 321A to 321H and 321R in the above-described embodiment are formed integrally with the protective sheet member 32 with the same material as the protective sheet member 32. Therefore, the number of parts can be reduced, and a need for a process of bonding the dielectric members 321A to 321H and 321R to the protective sheet member 32 can be eliminated, which further reduces cost.

In addition, in the above-described embodiment, the metallic frames 52A to 52H and 52R of the push switches 5A to 5H and 5R exposed to the outside are electrically connected to the touch detecting electrodes 6A to 6H and 6R. Therefore the metallic frames 52A to 52H and 52R function as a part of the touch detecting electrodes 6A to 6H and 6R. Thus, even when the user touches central regions of the operation regions corresponding to the push switches 5A to 5H and 5R where the conductor patterns of the touch detecting electrodes 6A to 6H and 6R are not present, the touch by the finger can be detected with high sensitivity.

Other Embodiments and Examples of Modification

In the operation switch section 3 of the tablet device 1 according to the foregoing embodiment, the grounding conductor 6GNDb is disposed in the regions corresponding to the touch detecting electrodes 6A to 6H and 6R on the back surface 4b of the circuit board 4, so that the touch by a finger of the user from the side of the back surface 4b of the circuit board 4 is not detected.

However, in consideration of a case where the tablet device is used while being held with both hands, for example, it may be preferable to be able to detect the touch on an operation region from the side of the lower case (i.e., the back side of the casing) of the tablet device 1.

Figure 6:
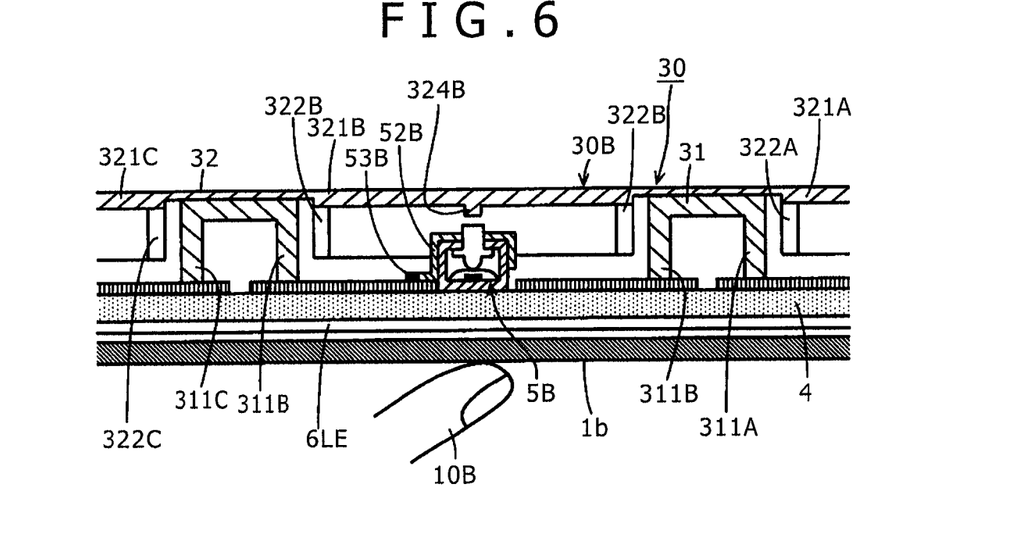
FIG. 6 is a diagram showing a sample construction of principal parts of another embodiment of the operation switch device according to the present invention.

Accordingly, as shown in FIG. 6, the grounding conductor 6GNDb is not disposed in the regions corresponding to the touch detecting electrodes 6A to 6H and 6R (FIG. 6 shows only the region corresponding to the touch detecting electrode 6B) on the back surface 4b of the circuit board 4. A conductor 6LE disposed on the back surface 4b of the circuit board 4 in FIG. 6 is a lead pattern, to which the terminals of the push switches 5A to 5H and 5R are connected via through holes, or a lead pattern, to which the touch detecting electrodes 6A to 6H and 6R are connected via through holes.

In this case, when a finger 10B of the user touches the region corresponding to the operation region 3B, as shown in FIG. 6, from the side of the lower case 1b of the tablet device 1, the touch detecting circuit 7 detects the touch by the finger 10B in a similar manner to that described above on the basis of a change in capacitance between the finger 10B and the touch detecting electrode 6B.

Figure 7:
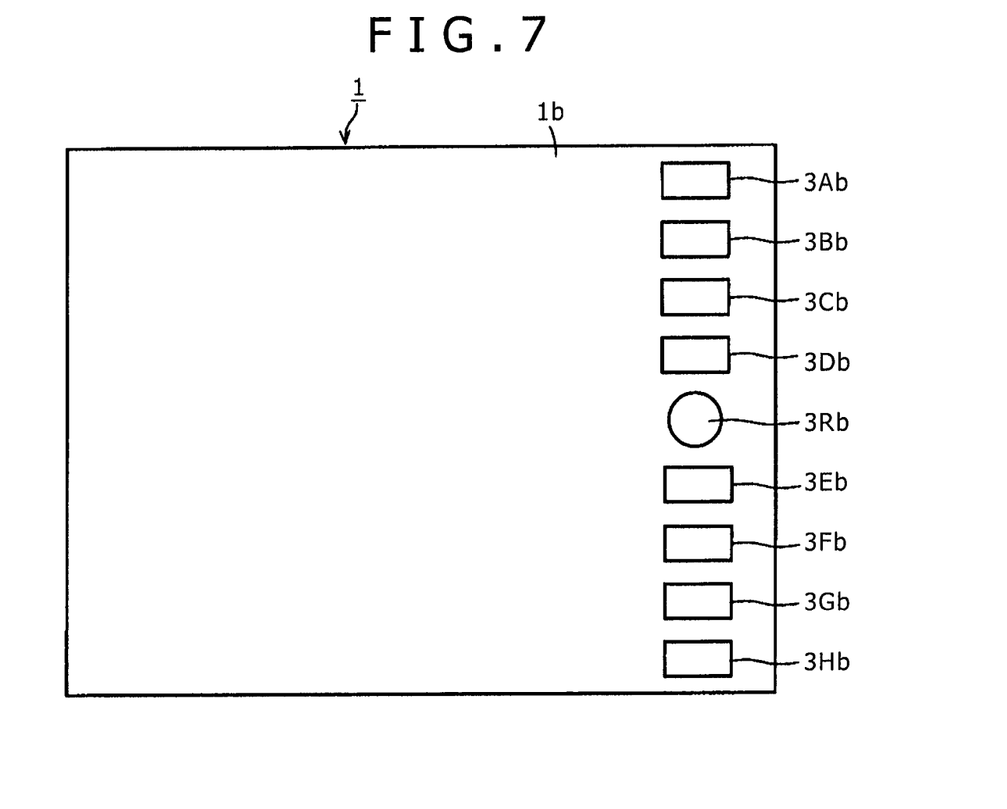
FIG. 7 is a diagram showing an external appearance of the back surface side of a tablet device as an example of an electronic device, to which another embodiment of the operation switch device according to the present invention is applied.

In this case, as shown in FIG. 7, it is preferable that operation regions 3Ab to 3Hb and 3Rb in the lower case 1b of the tablet device 1, which correspond to the operation regions 3A to 3H and 3R of the operation switch section 3 on the side of the upper case 1a, can be distinguished from each other by providing variation to the surface of the lower case 1b such as by defining depressions and ribs. In addition, the operation regions 3Ab to 3Hb and 3Rb may be arranged in place of the operation regions 3A to 3H and 3R of the operation switch section 3 on the side of the upper case 1a. Further, when the operation regions 3A to 3H and 3R of the operation switch section 3 are arranged along one end side on the side of the upper case 1a, the operation regions 3Ab to 3Hb and 3Rb may be arranged along the other end side of the tablet device 1 but on the side of the lower case 1b.

In the example of FIG. 6, no conductor is disposed on the back surface 4b of the circuit board 4 in the regions corresponding to the touch detecting electrodes 6A to 6H and 6R. However, these regions may have conductors disposed therein, which are electrically connected to the touch detecting electrodes 6A to 6H and 6R on the surface 4a of the circuit board 4 via through holes.

Next, the foregoing embodiment represents a case where the operation switch devices according to the present invention are applied to a tablet device being connected to a PC or the like. However, the present invention is not limited to such an example. For example, the operation switch device according to the present invention may be included in an electronic device such as a portable telephone terminal, a pad type PC (tablet PC), or the like.

Figure 8:
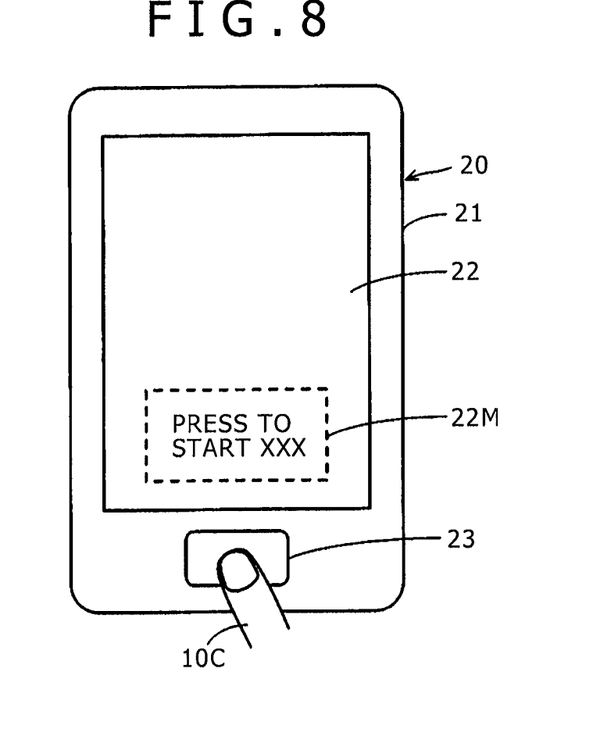
FIG. 8 is a diagram showing an external appearance of a portable telephone terminal as another example of an electronic device, to which an embodiment of the operation switch device according to the present invention is applied.

FIG. 8 is a diagram showing an example in which the operation switch device according to the present invention is applied to a portable telephone terminal referred to as a "smart phone." The example of FIG. 8 is a case of an operation switch device having one operation region.

Specifically, as shown in FIG. 8, the portable telephone terminal 20 in the present example has a display screen 22 of a display device formed by an LCD (Liquid Crystal Display), for example, in an upper surface of a casing 21. In the example of FIG. 8, an operation region 23 formed by a member made of a dielectric formed in a similar manner to the operation regions 3A to 3H and 3R in the foregoing embodiment is disposed on a lower part side of the display screen 22.

Though not shown in FIG. 8, as in the foregoing embodiment, a circuit board is disposed at a position corresponding to the operation region 23 within the casing 21, one push switch is attached on the circuit board, and a touch detecting electrode is formed on the periphery of the push switch. A touch detecting circuit and a switch state detecting circuit are also provided on the circuit board. The above configuration is the same as the configuration of one operation region in the foregoing embodiment.

In the example of FIG. 8, a control section formed by a microcomputer provided in the portable telephone terminal 20 is supplied with the touch detection output of the touch detecting circuit and the output of the switch state detecting circuit. The portable telephone terminal 20 in the present example is configured to execute a predetermined application program in response to a pressing operation on the operation region 23. Based on the touch detection output from the touch detecting circuit, the control section of the portable telephone terminal 20 performs control to display an icon for instructing a specific processing operation or to display description of the instruction on the display screen 22. The control section further performs control to execute the application program based on a pressing operation on the operation region 23 corresponding to the display image.

Specifically, when the touch detecting circuit detects the touch by a finger 100 of a user on the operation region 23, as shown in FIG. 8, the control section of the portable telephone terminal 20 displays a massage 22M indicating that a predetermined application program will be started in response to a pressing operation on the operation region 23. When the switch state detecting circuit then detects that the operation region 23 is pressed and a corresponding push switch is depressed, the control section of the portable telephone terminal 20 starts the application program corresponding to the depression of the operation region 23 on the basis of the detection output from the switch state detecting circuit.

As described above, according to the example of FIG. 8, when the operation region 23 is touched, a screen display corresponding to the touch on the operation region 23 is generated, and when the operation region 23 is thereafter pressed, a desired application program is started. That is, the user can verify in advance the function assigned to the operation region 23 by touching the operation region 23, and thereafter start the corresponding application program by performing a pressing operation on the operation region 23 as a confirming operation. Of course the operation based on the touch operation and the operation based on the pressing operation described above are examples only, and the present invention is not limited to these examples.

In the foregoing embodiment, the sensitivity of the touch detecting electrodes is further improved by forming ribs on the periphery of the dielectric members 321A to 321H and 321R disposed within the through holes 310A to 310H and 310R of the plate-shaped member 31 of the operation board section 30. However, the present invention is not limited to the thin ribs as shown in the figures.

Figure 9A:
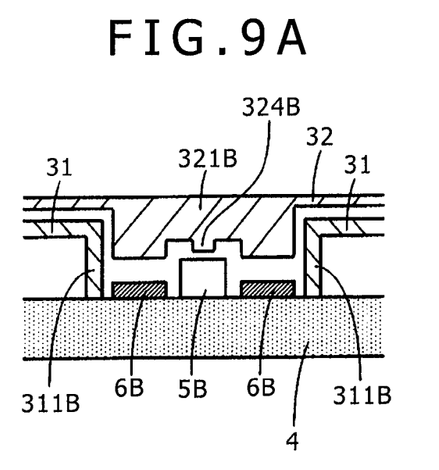
FIGS. 9A and 9B are diagrams illustrating other embodiments of the operation switch device according to the present invention.
Figure 9B:
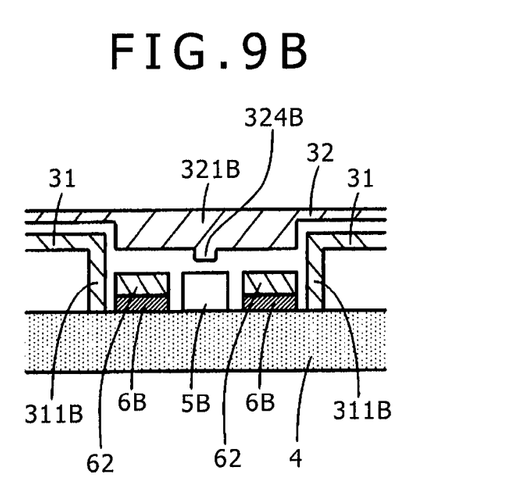

For example, as shown in FIG. 9A, the dielectric members as a whole may be configured to be thick except for the parts where the push switches are arranged. Alternatively, as shown in FIG. 9B, the sensitivity of the touch detecting electrodes (6B) may be further improved by providing a conductor 62 on the touch detecting electrodes (6B) such that the conductor 62 is superposed on the touch detecting electrodes (6B), to thereby shorten an effective distance between the dielectric members (321B) and the touch detecting electrodes (6B), while the thickness of the dielectric members is made constant.

Figure 10A:
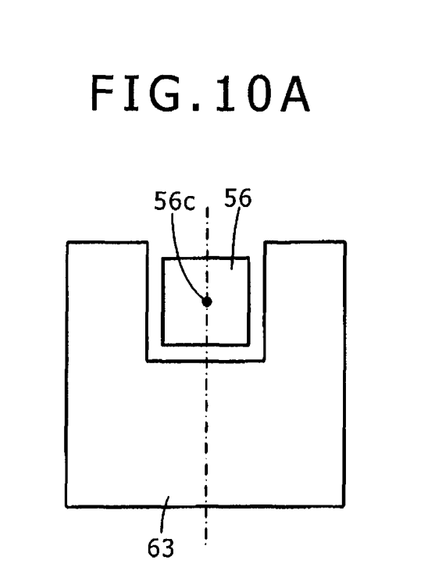
FIGS. 10A and 10B are diagrams illustrating other embodiments of the operation switch device according to the present invention.

In addition, in the foregoing embodiment, the push switches are disposed at the centers of the regions occupied by the touch detecting electrodes (6A-6H and 6R). However, the push switches do not need to be disposed at the centers. For example, as shown in FIG. 10A, a touch detecting electrode 63 in a U-shaped form may be formed on the surface 4a of the circuit board 4 (not shown), and a push switch 56 may be disposed in a region surrounded by the touch detecting electrode 63 in the U-shaped form. In the present example, as shown in FIG. 10A, the touch detecting electrode 63 has an axisymmetric electrode shape with respect to a dashed line including a central point 56C of the push switch 56 as an axis of symmetry, to ensure uniform sensor sensitivity for a touch operation on the operation region 23.

Figure 10B:
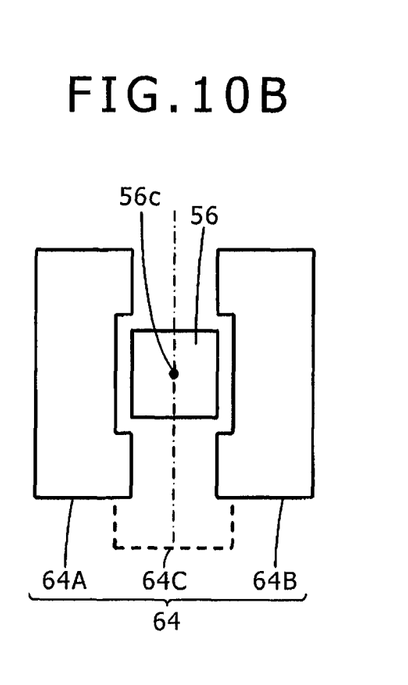

In addition, a touch detecting electrode disposed on the periphery of a push switch may be formed of a plurality of conductor patterns electrically connected to each other, rather than a single conductor pattern. For example, as shown in FIG. 10B, a touch detecting electrode 64 may be formed by connecting two conductor patterns 64A and 64B, dividedly placed on both sides of a push switch 56, to each other by a through hole 64C, for example. In the present example, as shown in FIG. 10B, the conductor patterns 64A and 64B have an electrode shape that is axisymmetric with respect to a dashed line including a central point 56C of the push switch 56 as an axis of symmetry. The electrode shape is further point-symmetric with respect to the central point 56C of the push switch 56 as a central point of symmetry, to ensure uniform sensor sensitivity for a touch operation on the operation region 23. A conductor pattern for connecting the two divided conductor patterns 64A and 64B to each other may of course be formed on the surface 4a of the circuit board 4 in place of in the through hole 64C.

In addition, though not shown, a push switch may be disposed on the surface 4a of the circuit board 4, and a touch detecting electrode may be formed on the back surface 4b of the circuit board 4. Also in this case, the touch detecting electrode when viewed in a direction orthogonal to the surface 4a of the circuit board 4 is formed in a region corresponding to an operation region, and is disposed on the periphery of the push switch. In this case, however, the surface on which the push switch is disposed and the surface on which the touch detecting electrode is formed are different from each other, that is, the surface 4a and the back surface 4b of the circuit board 4. The touch detecting electrode can therefore be formed so as to correspond to the entire operation region including the region corresponding to the position on which the push switch is disposed.

In addition, in the foregoing example, the through holes 310A to 310H are provided in the plate-shaped member 31, and the push switches 5A to 5H are pressed by depressing the protective sheet member 32 in the direction toward the through holes 310A to 310H. However, the present invention is not limited to such a constitution. Though not shown, for example, an incision may be made in the protective sheet member 32 along the rectangular shape of the through holes 310A to 310H except for one side (for example a short side) of the above-described rectangle. Then, the rectangular part formed by the incision in the protective sheet member 32 becomes rotatable with the side of the rectangle as a support axis of rotation, so that a pressing operation on the push switches 5A to 5H can be performed. In this case, it is preferable that a dielectric member be formed on each of the rectangular parts formed by the incision in the protective sheet member 32 on the side of the push switches 5A to 5H. It is further preferable that a rib as a projecting part for improving touch detection sensitivity be formed at least on a side opposed to the side that serves as the support axis of rotation.

The push switches are not limited to the push switches in the foregoing example, and may be any electronic parts without being limited to switches as long as the electronic parts are elements capable of detecting a pressing operation on the operation regions.

In addition, the above description has been made of a case where the operations of touching and pressing an operation member by a finger are detected. It is needless to say, however, that the indicator performing the operations is not limited to a finger, but may be a capacitive pen.

What is claimed is:

1. An operation switch device, comprising:
a circuit board;
first and second push switches disposed on the circuit board to have a determined height above the circuit board, each of the push switches including a movable part exposed to an outside for reacting to an external pressing operation;
first and second touch detecting electrodes formed on the circuit board respectively in proximity to the first and second push switches;
an operation detecting circuit connected with the push switches and the touch detecting electrodes; and
an operation member made of dielectric material and disposed to oppose the circuit board with the first push switch interposed between the operation member and the circuit board, the operation member including a rib part projecting toward the first touch detecting electrode on the circuit board to reduce a distance between the operating member and the first touch detecting electrode, the rib part including a cutaway part to increase a distance between the operating member and the second touch detecting electrode, and the operation member being displaceable such that the pressing operation on the operation member causes depression of the movable part of the first push switch provided under the operable member;
wherein the operation detecting circuit detects a touch operation on the operation member using the first touch detecting electrode formed in proximity to the first push switch on the circuit board, and detects the pressing operation on the operation member using the first push switch.

2. The operation switch device according to claim 1, wherein the dielectric material has a higher dielectric constant than air.

3. The operation switch device according to claim 2, wherein the dielectric material has elasticity.

4. The operation switch device according to claim 2, wherein the rib part has a square shape having four sides, of which two opposing sides are projecting toward the first touch detecting electrode and other two opposing sides define the cutaway part.

5. The operation switch device according to claim 1, wherein a distance between the rib part and the circuit board is set smaller than a height of the first push switch above the circuit board.

6. The operation switch device according to claim 1, wherein the first touch detecting electrode has an electrode shape corresponding to an operation region for the touch operation.

7. The operation switch device according to claim 6, wherein the first touch detecting electrode has an axisymmetric shape whose axis of symmetry includes a central point of the first push switch.

8. The operation switch device according to claim 1, wherein the first and second touch detecting electrodes are disposed on another surface of the circuit board, which is opposite to a surface of the circuit board on which the first and second push switches are disposed.

9. The operation switch device according to claim 1, wherein a metallic member is disposed on a peripheral part of the first push switch, and the metallic member of the first push switch is connected to the first touch detecting electrode.

10. The operation switch device according to claim 1, further comprising:
a second operation member including a second rib part projecting toward the second touch detecting electrode,
wherein the two operation members share a common boundary portion, and the cutaway part of the rib part projecting toward the first touch detecting electrode is formed along the common boundary portion to increase a distance between said rib part and the second touch detecting electrode.

11. An operation switch device, comprising:
a circuit board;
first and second push switches disposed on the circuit board, each of the push switches including a movable part configured to move in response to a pressing operation;
first and second touch detecting electrodes formed on the circuit board respectively in proximity to the first and second push switches;
an operation detecting circuit connected with the push switches and the touch detecting electrodes; and
an operation member made of dielectric material and disposed to oppose the circuit board with the first push switch interposed between the operation member and the circuit board, the operation member including a rib part projecting toward the first touch detecting electrode on the circuit board to reduce a distance between the operating member and the first touch detecting electrode, the rib part including a cutaway part to increase a distance between the operating member and the second touch detecting electrode, and the operation member being displaceable such that the pressing operation on the operation member moves the movable part of the first push switch provided under the operable member;
wherein the operation detecting circuit detects a touch operation on the operation member using the first touch detecting electrode formed in proximity to the first push switch on the circuit board, and detects the pressing operation on the operation member using the first push switch.

12. The operation switch device according to claim 11, wherein the operation detecting circuit detects a touch operation on the operation member using the first touch detecting electrode based on a capacitive touch detection system.

* * * * *